United States Patent
Salmon et al.

(10) Patent No.: US 7,163,830 B2
(45) Date of Patent: Jan. 16, 2007

(54) METHOD FOR TEMPORARILY ENGAGING ELECTRONIC COMPONENT FOR TEST

(76) Inventors: Peter C. Salmon, 200 E. Dana St., #8, Mountain View, CA (US) 94041; Howard Johnson, P.O. Box 1309, Twisp, WA (US) 98856

( * ) Notice: Subject to any disclaimer, the term of this patent is extended or adjusted under 35 U.S.C. 154(b) by 0 days.

(21) Appl. No.: 11/007,720

(22) Filed: Dec. 7, 2004

(65) Prior Publication Data

US 2006/0079009 A1   Apr. 13, 2006

Related U.S. Application Data

(60) Provisional application No. 60/617,716, filed on Oct. 12, 2004.

(51) Int. Cl.
*H01L 21/66* (2006.01)
*H01L 29/40* (2006.01)

(52) U.S. Cl. .......................... 438/18; 257/778

(58) Field of Classification Search ................ 257/698, 257/708, 777–781; 361/688; 438/14–18, 438/108, 109, 612–617, 667, 672
See application file for complete search history.

(56) References Cited

U.S. PATENT DOCUMENTS

| | | |
|---|---|---|
| 5,800,060 A | 9/1998 | Speckbrock et al. |
| 6,881,609 B1 * | 4/2005 | Salmon ........................ 438/107 |
| 6,927,471 B1 * | 8/2005 | Salmon ........................ 257/499 |
| 6,942,493 B1 | 9/2005 | Matsunaga |
| 6,956,284 B1 | 10/2005 | Cady et al. |
| 7,009,412 B1 | 3/2006 | Chong et al. |
| 6,990,176 B1 | 6/2006 | Sherman et al. |
| 2005/0254214 A1 * | 11/2005 | Salmon ........................ 361/699 |
| 2005/0255722 A1 * | 11/2005 | Salmon ........................ 439/67 |

* cited by examiner

*Primary Examiner*—Calvin Lee
(74) *Attorney, Agent, or Firm*—Dorsey & Whitney LLP

(57) ABSTRACT

An electronic socket is described for providing either or both temporary and permanent attachments of electronic components to a substrate having interconnection circuits. The socket includes wells filled with a conductive fluid or paste for temporary attachment to the mesas of an electronic circuit. The wells are connected to selected traces of the substrate having interconnection circuits. The temporary connection may be used to produce known good die (KGD), including support of burn-in and high-speed functional test. The mesas can be filled with a material that is hardened after insertion of the mesas for permanent connection of the electronic circuit to the interconnect circuit.

5 Claims, 3 Drawing Sheets

Scale: ~ 500X

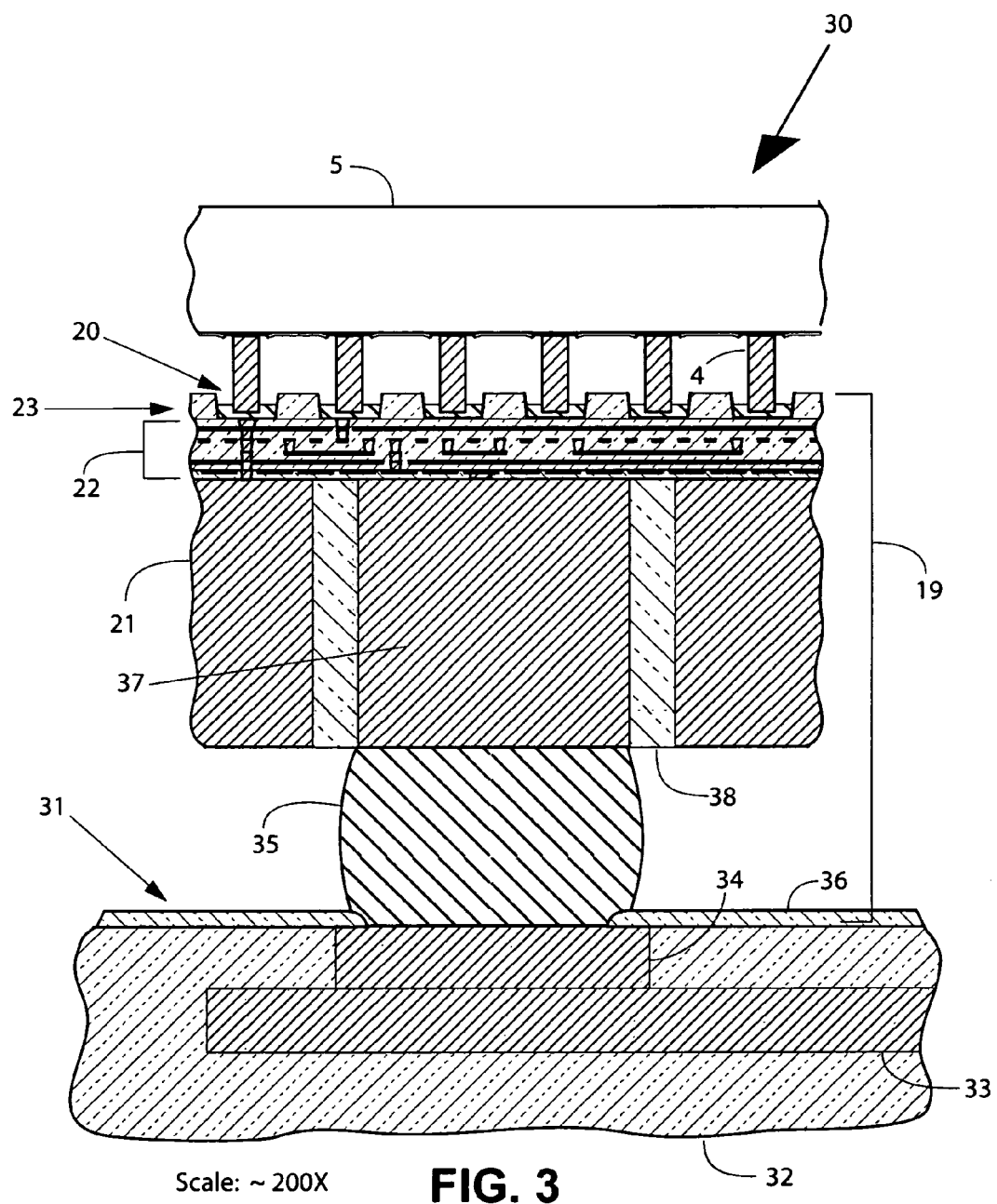
Scale: ~ 200X  FIG. 3

METHOD FOR TEMPORARILY ENGAGING ELECTRONIC COMPONENT FOR TEST

RELATED APPLICATIONS

This application claims priority to Provisional Application Ser. No. 60/617,716 filed Oct. 12, 2004.

THE INVENTION

This invention relates to a socket for an electronic component, and more particularly to a fine-pitch electronic socket that can be used either as a temporary connection or a permanent attachment.

BACKGROUND OF THE INVENTION

For several decades it has been customary to mount a semiconductor die inside a discrete package and to mount the package on a printed circuit board, (PCB). Within the package, wire bonds have been commonly used to connect from input/output (I/O) pads on the die to terminals on the package, plus soldered connections (through-hole or surface mount) between external package terminals and corresponding terminals on the PCB.

In recent years, a new method of assembly called "direct chip attach" or "flip chip" has been used for high-speed integrated circuit (IC) chips. In the most popular flip chip method, I/O pads on the die are bumped with solder material. The die is attached to lands on a substrate by flipping the die, aligning it to the substrate, and melting (reflowing) the bumps. Flip chip attachments are preferably used for higher-speed circuits because the parasitic impedance of the connections is generally much less than for wire-bonded connections. However, direct attachment from chip to board is not typically achieved; an intermediate substrate with redistribution circuits is usually required. The redistribution circuits map signals between the fine features of the chip and the coarser features of the board.

Semiconductor chips are normally tested at wafer sort wherein metal probes on a probe card are brought into contact with each of the I/O pads, thereby connecting them to corresponding nodes within a tester. By this means they are tested functionally and parametrically. Functional testing is used to verify logic behavior, and parametric testing is used to verify that analog quantities like supply current and leakage current are within bounds. Typically, wafer sort will be effective in rejecting around 90% of the defective chips, and the remaining 10% will be rejected at "class test" which is a final test at the component level. Class testing is usually performed on packaged parts and typically includes full speed functional tests, not limited by the high parasitic impedance of the probes. However, the discrete packaged part option may not exist for some modern packaging approaches such as chip-on-board (COB), or stacked die packages. In the case of COB, a rework procedure may allow the board to be corrected, although such repair will typically be time-consuming and costly. For the case of the stacked die package, the whole assembly must be rejected, because it is typically not possible to replace any defective chips in the stack. Herein lies the motivation for the temporary socket of the current invention. If a temporary socket exists that allows full speed operation, it can be used to perform a class test or final test at either the wafer level or on separated die to produce known good die (KGD). The confidence level in these KGD will be higher than is currently achievable because the testing will have been more thorough. This higher confidence level translates into lower system cost because of yield factors, wherein some percentage of completed assemblies will be wasted if a "KGD" turns out to be defective.

A similar temporary socket may also be used for burning-in singulated die (diced and separated from a wafer), wherein the die is stressed at temperature and voltage extremes that are typically employed to identify marginal components. Performing burn-in using conventional wafer sort equipment is difficult, requiring hot chucks, long test times, and a massive number of connections between the I/O pads of a full set of chips on a wafer and their corresponding tester nodes. The temporary socket provides a way for KGD to be produced with a high level of confidence; when assembled into higher-level components they are guaranteed to be good, except for potential assembly issues not relating to chip quality.

Processes have been developed for fabricating copper mesas or pillars onto the I/O pads of IC chips. Like solder balls used in ball grid arrays (BGAs), copper mesas are "bumps". However, in contrast to the stiffness of solder balls, they can be produced with a length:diameter ratio that provides flexibility at the connection, an important advantage for reliable connections. One proven fabrication method is to electroform the mesas in a plating solution, using photo resist to define the columns to be plated. Special photo resists have been developed for this purpose, such as SU-8 2000, available from Microchem, Newton, Mass., USA. This resist can be patterned with a thickness of 60 µm for example, using a single spin-coating. The sidewalls of the resist can be essentially vertical, and special techniques for stripping the thick resist are available. Under bump metallizations (UBMs) have been developed to provide reliable inter-metallic junctions between aluminum or copper pads and the plated mesas. Also, the plating process is capable of electroforming mesas with aspect ratios as high as 10:1, especially using periodic pulse-reversing power supplies.

SUMMARY OF THE INVENTION

A new type of flip chip attachment called MesaWell is described herein that allows fine pitch connections between chip and substrate. Each MesaWell connection includes a copper mesa inserted into a well filled with solder. The copper mesa is preferably electroformed using processes known in the art. In order to provide re-workability at the chip-to-substrate interface, a special assembly layer is provided on the substrate. This special layer includes wells that can be filled with solder paste, preferably using a squeegee. The copper bumps are inserted into the solder paste in the wells to create the flip chip connection. An advantage of the MesaWell attachment is that the copper mesas act like flexible beams that bend to relieve shear stress developed between the chip and the substrate, typically during temperature cycling. Thus the MesaWell connections form a mechanically compliant interface. If solder balls were used instead of copper mesas, the attachment would be stiffer, typically requiring an epoxy under layer to strengthen the joint for chip sizes larger than 3 mm on a side. Without the extra strength provided by the epoxy, larger die may develop cracks at the interface, and reliability studies have shown such assemblies to be unacceptable. Also, rework of a defective chip becomes problematic if epoxy is used because it is almost impossible to remove it without damaging the substrate. Removal procedures typically include application of gelatinized solvents using Q-tips and the like. This type of procedure is time-consuming and expensive and often results in damaged leads, particularly for fine-pitch packages.

A defective chip that is "permanently" attached using MesaWell connectors can be replaced using a straightforward rework procedure. The procedure typically involves preheating the substrate from below, applying hot inert gas to the defective chip from above, and withdrawing the chip when the solder melts in the wells. Remaining solder is sucked out of the wells in liquid form. New solder paste is deposited in the wells using a miniaturized squeegee, and a replacement chip can then be assembled and tested.

The geometry of the wells suggests the possibility of forming temporary connections, by filling them with mercury for example. Other conductive fluids could also be used including ionic solutions or electrolytes; also conductive gels or solder pastes.

Unfortunately, dangerous levels of mercury vapor could be produced in typical work environments, and disposal of even small quantities of liquid mercury creates an environmental hazard. Although regular assembly production could potentially be conducted under an exhaust hood, the use of mercury in the wells would be hazardous for humans in typical rework environments.

The reactive species in electrolytes and ionic solutions are typically serious contaminants in semiconductor environments. This problem is overcome in plating applications by keeping the fluids away from active semiconductor junctions, and by thorough rinsing and cleaning to flush away unused materials. Another issue for this type of material is that the volume of material in each well is so small that it may dry out before the rework process is complete.

U.S. Pat. No. 5,800,060 by Gerd Speckbrock et al describes non-toxic gallium alloys to be used as a replacement for mercury in thermometers. Many gallium alloy formulations are liquid at room temperature. Various constituents can be added to improve the properties for a given application: these include indium to lower the melting point, antimony to raise the oxidation resistance, and bismuth to improve fluidity.

BRIEF DESCRIPTION OF THE DRAWINGS

FIG. 3 illustrates in cross-section an assembly including both MesaWell and solder bump connections drawn to scale;

DETAILED DESCRIPTION OF THE PREFERRED EMBODIMENTS

Figure 1:
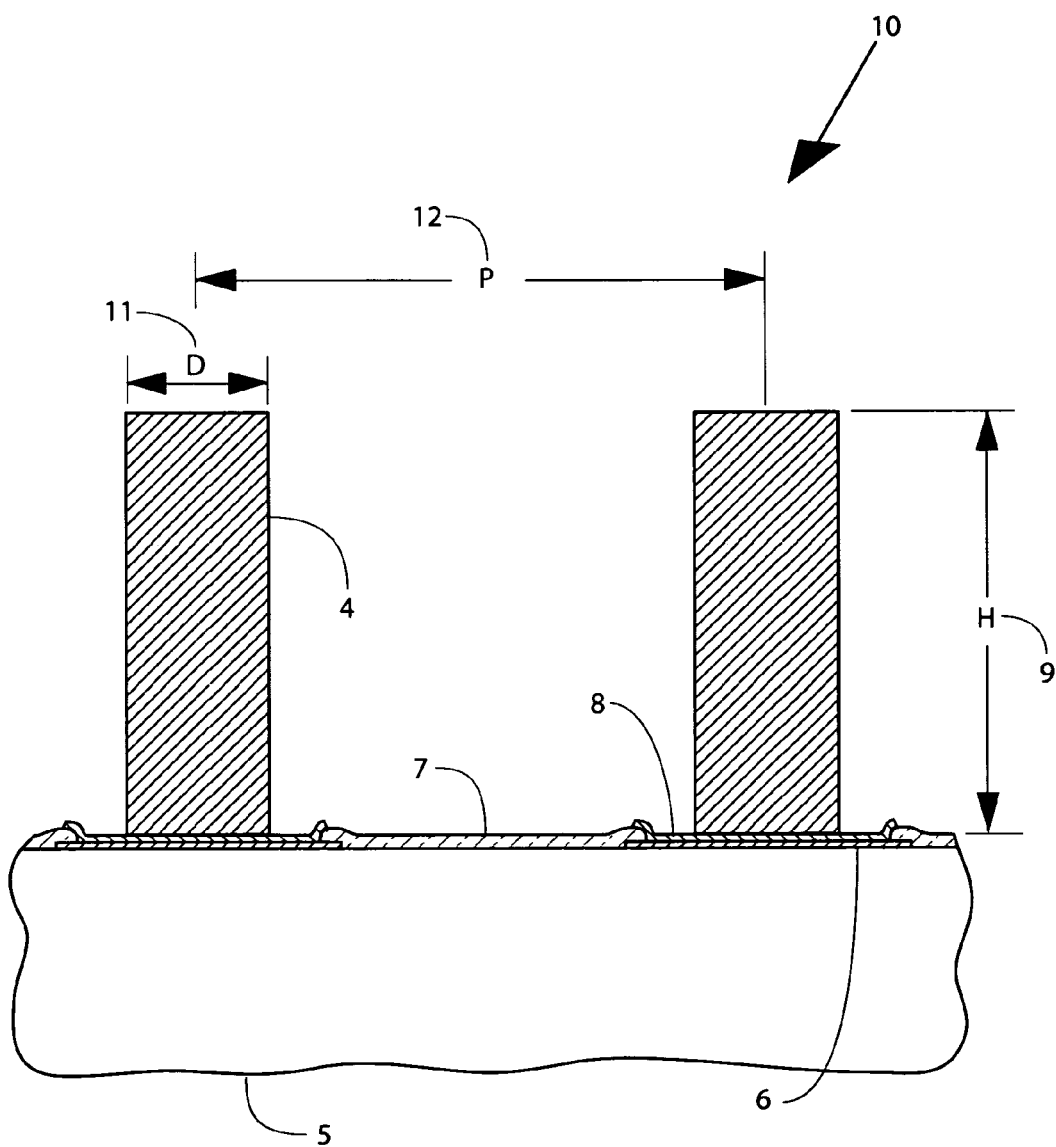
FIG. 1 is a cross-sectional view of a fragment of an IC chip with closely spaced copper mesas formed over input/output pads.

FIG. 1 shows a fragment 10 of a bumped semiconductor wafer 5 with I/O pads 6, a passivation layer 7, and an under bump metallization (UBM) 8 covering each pad. The chips on the wafer may perform digital, analog, or RF functions for example. The wafer is processed to create the active devices and may be silicon or any other semiconductor material. Passivation layer 7 is typically silicon nitride, and the UBM 8 may consist of an adhesion layer such as chromium plus a seed layer of copper. Other UBM constructions are known in the art. Copper mesas 4 have been electroformed on each I/O pad, using plating processes known in the art. Copper mesa 4 is a form of bump, an improvement over the more common solder ball used in many flip chip connections. The mesas provide electrical connectivity, flexural behavior for relieving stresses, and thermal conductance that will help in cooling chip 5. Their dimensions support their flexural behavior, especially a high ratio of length to diameter. For typical operating environments and chip sizes up to 2 centimeters on a side, a preferred height H, 9, is 60 μm and a preferred diameter D, 11, is 10 μm. Essentially the mesas behave like fine copper wires. The ends of the "wires" (mesas) can move to adapt to differential expansion between chip and a substrate that they connect to. In principle, their height and diameter can be adjusted to form a compliant interface for any size of chip, and for any reasonable temperature range required. A preferred pitch P, 12, between mesas is 80 μm, enabling over 1.5 million connections per square centimeter. This compares with a typical pitch of 800–1000 μm for solder balls in a BGA for assembly to a glass-epoxy laminate (PCB), and with a typical pitch of 250 μm for assembly to an intermediate package substrate. After the plating process is complete, and before stripping the supporting photo resist, it is desirable to polish the bumped wafer using a chemical mechanical polishing (CMP) step to achieve planarity of the mesa tips; after this CMP step the tips should be co-planar within 1–2 μm.

Figure 2:
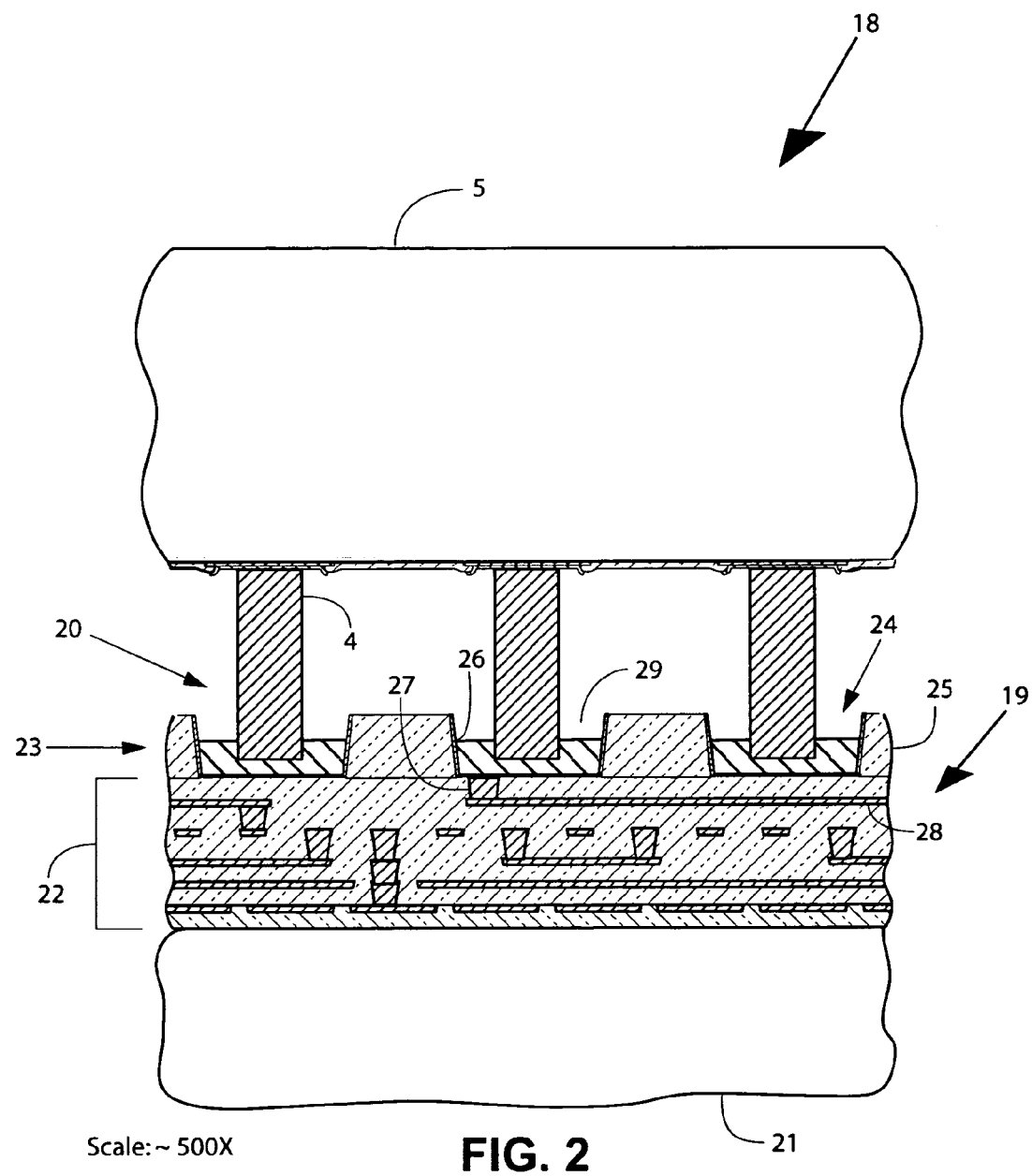
FIG. 2 is a cross-sectional view of MesaWell connections between a chip and a substrate.

FIG. 2 shows a flip chip assembly 18 of semiconductor chip 5 to interconnection substrate 19 using MesaWell connectors 20. Semiconductor chip 5 has typically been thinned to approximately 100 μm for improved cooling and greater miniaturization. Interconnection substrate 19 includes substrate 21 to be further described in reference to FIG. 3, interconnection circuits 22, and a special assembly layer 23. Assembly layer 23 includes wells 24 patterned in a thick layer of dielectric 25. A preferred process for fabricating interconnection circuit 22 is offered by Unitive, Inc., of North Carolina, recently acquired by Amkor Technology Inc. This process includes fine-featured copper conductors built up using electroplating, and BCB dielectric layers. Benzocyclobutene (BCB) is sold as Cyclotene by The Dow Chemical Company. Wells 24 are preferably patterned in BCB 25 with a preferred depth of approximately 15 μm. Upon melting, the volume of solder paste typically reduces to approximately one half. The sidewalls and bottoms of the wells are coated with a conductive layer 26, preferably copper, and connect using via 27 or other conductive structure to a trace such as 28 of interconnection circuit 22.

An important part of the current invention is that the MesaWell structure can be used for either or both temporary and permanent connections. For the temporary connection a conductive fluid or paste is used in the wells; a liquid metal is used in the preferred embodiment. For the permanent connection the preferred conductive material in the wells is a solder paste that is soft during the assembly process, and is converted by melting (reflow) to form a binding solid. Other conductive materials can be used, such as organic pastes filled with conductive particles that are cured to form binding solids: conductive epoxies for example. The solid material binds the mesas to the wells, providing electrical and thermal conductivity through the connection, plus mechanical attachment of the bumped part to the part containing the wells. A preferred paste for the permanent connections is 57Bi42Sn1Ag containing 57% bismuth, 42% tin, and 1% silver. This paste is lead-free (an important environmental consideration) and melts at 140° C., with a typical reflow duration of 30–90 seconds at 175° C. This melting point is lower than the 183° C. melting point of the popular eutectic solder 63Sn37Pb. If the lower temperature is acceptable in the system design considering all post-assembly processes and potential storage and operating conditions, it has the advantage that lower stresses are induced when the solder is reflowed for permanent attachment or for rework. For higher temperature environments such as automotive applications, a higher melting point will be required. Preferred pastes for higher temperature applications include 96.5Sn3.5Ag with a melting point of 221° C., and 88Au12Ge with a melting point of 356° C. Use of these pastes and higher melting points implies that the copper mesas will need to be longer, to relieve a greater thermal stress induced during permanent attachment or rework.

Without limiting the scope of this invention, the following example illustrates the use of liquid metal in the wells, as opposed to other possible conductive fluids or pastes. A pool of the liquid metal is dispensed onto the surface containing the wells using a syringe for example, and a squeegee is used to spread the material and push it into the wells. Substrate 21 may be a copper wafer having the same size and shape as a semiconductor wafer; it may also be a semiconductor wafer. In either case, a special assembly layer is fabricated on top of the wafer to form the wells. For logic circuits such as microprocessors a high density of wells is typically required (up to several thousand input/output connections per square centimeter). Thus, although a special assembly layer may include millions of wells they can all be filled with a single pass of the squeegee, leading to a low fabrication cost per well. The wells are preferably deep enough to provide vertical compliance during assembly, allowing chips to be assembled without breakage. Some chip breakage typically occurs when assembling solder ball grid arrays because the air gap between solder ball and corresponding land must be eliminated for good solder joints, yet the tips of the solder bumps are not perfectly co-planar. In the current invention the wells are preferably around 15 µm deep and the paste is soft, so typical non-planarities of 1–2 µm at the tips of the mesas are easily accommodated, with no yield loss due to chip breakage.

The comparative size of MesaWell connections 20 and typical solder bump connections 35 is illustrated in FIG. 3 which is drawn at a scale of approximately 200× and depicts all of the layers and connections in a preferred stackup 30 between a PCB 31 and a semiconductor chip 5. PCB 31 typically includes glass-epoxy laminate 32, copper traces 33, and lands 34 for connecting between traces like 33 and corresponding solder bumps 35. Lands 34 are surrounded by a solder mask layer 36. Solder bumps 35 are fabricated as terminals of a ball grid array on interconnection substrate 19, introduced in reference to FIG. 2. Interconnection substrate 19 preferably includes a copper substrate 21 with feedthroughs 37 isolated from substrate 21 by insulating cylinders 38. This arrangement is described in Salmon's co-pending U.S. patent application Ser. No. 10/783,662. Interconnection substrate 19 also includes interconnection circuits 22, and special assembly layer 23, previously described in reference to FIG. 2. The large size of solder ball 35 compared with a MesaWell connector 20 is apparent. A typical pitch for the ball grid array is 0.8 mm, ten times larger than the preferred pitch of 0.08 mm for the MesaWell connections. In addition, the MesaWells can be configured as temporary or permanent connections, are re-workable even in their "permanent" form, and support higher speed circuits because of their smaller size.

What is claimed is:

1. A method for use with a tester and an electronic component having an array of conductive mesas at terminals of said component, comprising the steps of:
   a) providing an assembly layer having an array of wells formed by conductive walls on a test substrate and corresponding to the array of conductive mesas of said component, the assembly layer being provided with electrical connections between said conductive walls and selected traces in said test substrate and a liquid metal disposed within the wells;
   b) connecting said selected traces to terminals of the tester; and
   c) inserting said mesas into said liquid metal in the wells for the duration of a test of said electronic component by said tester.

2. The method of claim 1 wherein said electronic component is a semiconductor chip.

3. The method of claim 1 wherein the providing step includes placing the liquid metal within the wells.

4. A method for use with a tester having a plurality of terminals and an electronic component having an array of conductive bumps for permitting electrical communication with the electronic component, comprising the steps of:
   a) providing an assembly layer having a plurality of wells disposed in an array corresponding to the array of conductive bumps for permitting registration of the array of conductive bumps with the array of wells, each of the wells being formed by a conductive wall and having a liquid metal therein;
   b) electrically connecting the conductive walls of the assembly layer with the respective terminals of the tester;
   c) inserting the conductive bumps into the liquid metal within the wells for permitting electrical communication between the tester and the electronic component;
   d) testing the electronic component with the tester; and
   e) removing the conductive bumps from the liquid metal within the wells after completion of the testing of the electronic component by the tester.

5. The method of claim 4 wherein the electronic component is a semiconductor chip.

* * * * *